(12) United States Patent
Chao et al.

(10) Patent No.: US 7,816,694 B2
(45) Date of Patent: Oct. 19, 2010

(54) LIGHT EMITTING SEMICONDUCTOR DEVICE

(75) Inventors: Tzu-Hao Chao, Taipei (TW); Chun-Peng Chen, Sinjhuang (TW)

(73) Assignee: Everlight Electronics Co., Ltd., Tu-Chen, Taipei Hsien (TW)

( * ) Notice: Subject to any disclaimer, the term of this patent is extended or adjusted under 35 U.S.C. 154(b) by 95 days.

(21) Appl. No.: 12/057,382

(22) Filed: Mar. 28, 2008

(65) Prior Publication Data
US 2009/0045417 A1  Feb. 19, 2009

(30) Foreign Application Priority Data
Aug. 15, 2007 (TW) .............................. 96213508 U

(51) Int. Cl.
*H01L 33/00* (2010.01)
(52) U.S. Cl. .............................. 257/89; 257/80; 257/88; 438/26; 438/28
(58) Field of Classification Search .................... 257/80, 257/88, 89, E33.036; 438/26, 28
See application file for complete search history.

(56) References Cited

U.S. PATENT DOCUMENTS

2006/0186425 A1* 8/2006 Yano et al. ..................... 257/98
2008/0149960 A1* 6/2008 Amo et al. ..................... 257/98

* cited by examiner

*Primary Examiner*—Phuc T Dang
(74) *Attorney, Agent, or Firm*—Pai Patent & Trademark Law Firm; Chao-Chang David Pai

(57) ABSTRACT

A light emitting semiconductor device is provided, wherein the light emitting semiconductor device comprises a substrate, a plurality of flip chips, a heat conductive board and an insulating board. These flip chips are electrically connected on the substrate. The heat conductive board has a protruding portion used to support the substrate. The insulating board has a plurality of connecting pads and an opening, wherein the protruding portion is sheathed in the opening, so as to expose the substrate. The exposed substrate is then electrically connected to the connecting pads.

10 Claims, 4 Drawing Sheets

LIGHT EMITTING SEMICONDUCTOR DEVICE

RELATED APPLICATIONS

This application claims priority to Taiwan Application Serial Number 96213508, filed Aug. 15, 2007, which is herein incorporated by reference.

FIELD OF THE INVENTION

The present invention relates to a light emitting semiconductor device, and particularly relates to a light emitting semiconductor device with three colors, such as colors red, green and blue (RGB) mixed together.

BACKGROUND OF THE INVENTION

Light emitting semiconductor devices have low power consumption, generate less heat, operate over long periods of time, are small in size, have high impact tolerance, can operate in high speed are mercury free and have good optical performance. Light emitting semiconductor devices have been applied as a light source with steady wavelengths to an electronic device.

The brightness and operation life of an LED device have been tremendously improved along with the development of optical technology, and may serve as the primary light source of an electronic device in the future.

A conventional light emitting semiconductor device, for example a light emitting diode (LED) device with white light, comprises a plurality of LED dies electrically connected with each other via bonding wires to constitute a matrix, and the process for connecting the bonding wires requires a predetermined pitch between each two adjacent LED dies. A wider pitch may be required when the matrix of the LED device is enlarged. However, the enlarged pitch may affect the mixing efficiency of light that is provided by each of the LED dies before emitting light from the LED device so as to result in color deviation or color temperature variation and to decrease the brightness of the LED device. Furthermore, the conventional way for connecting the LED dies to form a LED device may requires more bias, it is necessary to provide an electrostatic discharger, such as zener diodes, set on the periphery of the LED dies to protect the LED device from undesired electrostatic discharge. However the electrostatic discharger may increase the size of the LED device and limits the number of the LED dies integrated in a particular package.

SUMMARY OF THE INVENTION

Therefore, it is desirable to provide an improved LED device with simple structure, small size and high brightness.

In some embodiments of the present invention, a light emitting semiconductor device is provided. In some embodiments of the present invention, the light emitting semiconductor device comprises a substrate, a plurality of flip chips, a heat conductive board and an insulating board. Wherein these flip chips are electrically connected on the substrate. The heat conductive board has a protruding portion used to support the substrate. The insulating board has a plurality of connecting pads and an opening, wherein the protruding portion is sheathed in the opening, thus the substrate is exposed from the opening. The exposed substrate is then electrically connected to the connecting pads.

In accordance with the above embodiments, the features of the present invention are to apply a flip chip technology to electrically connect a plurality of LED dies onto a substrate to replace conventional LED dies that are electrically connected by bonding wires. In comparison with the prior LED devices, the flip chip LED dies requires smaller pitch between each two adjacent LED dies, thus the substrate that has a limited mounting surface can have more LED dies set thereon. Light provided by the LED dies may be mixed more efficiently before being emitted from the LED device due to the smaller pitch, and the brightness of the LED device can also be improved.

In addition, a heat conductive board having a protruding portion is used to support the substrate, and an insulating board having an opening is provided, by which the protruding portion is sheathed and the substrate that mounted on the protruding portion is exposed from the opening. The LED dies mounted on the substrate are then electrically connected to the pads of the insulating board. Thus heat that is generated by the LED dies can be dispersed via the heat conductive board directly, and the LED dies are electrically interconnected to external devices though interconnects set in the insulating board without any obstacle. Since heat dispersing pathway and the electrical connection of the LED dies are separated, heat generated by the LED dies can be dispersed more efficiently, and the circuit space can be increased, such that the pitch between the LED can be further decreased and the circuit space of the substrate can be increased to have more LED dies or electrostatic dischargers set thereon, whereby the reliability and die integration of the resulting LED device may be improved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The foregoing aspects and many of the attendant advantages of this invention will become more readily appreciated and better understood by reference to the following detailed description of preferred embodiment as a LED device, when taken in conjunction with the accompanying drawings. It should be appreciated that the features and invention concepts may be applied on other light emitting semiconductor device with various light-emitting semiconductor chips, such as ultra high efficiency LED chips or a laser diode chips.

Figure 1A:
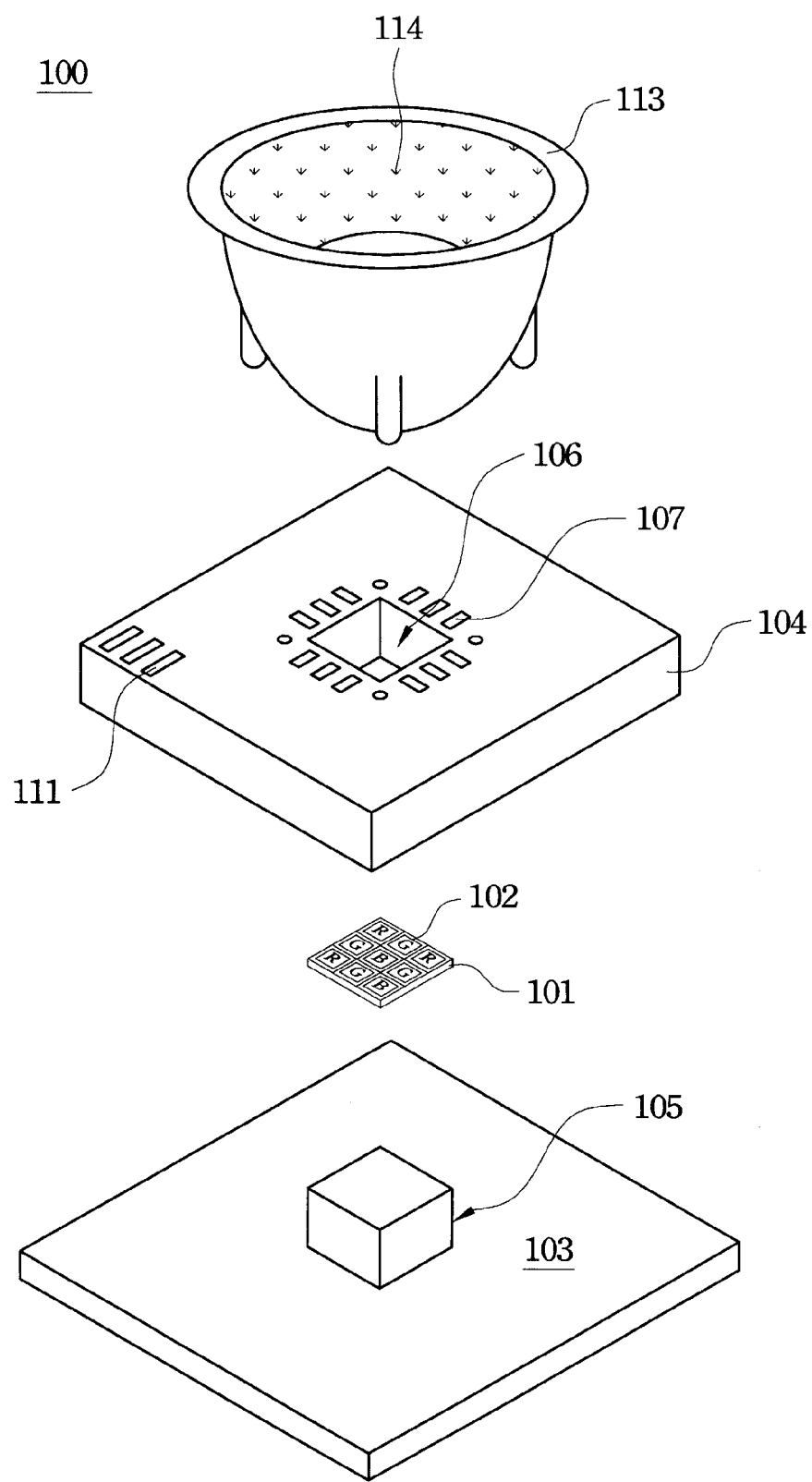
FIG. 1A illustrates an explosion of a LED device 100 in accordance with a preferred embodiment of the present invention.
Figure 1B:
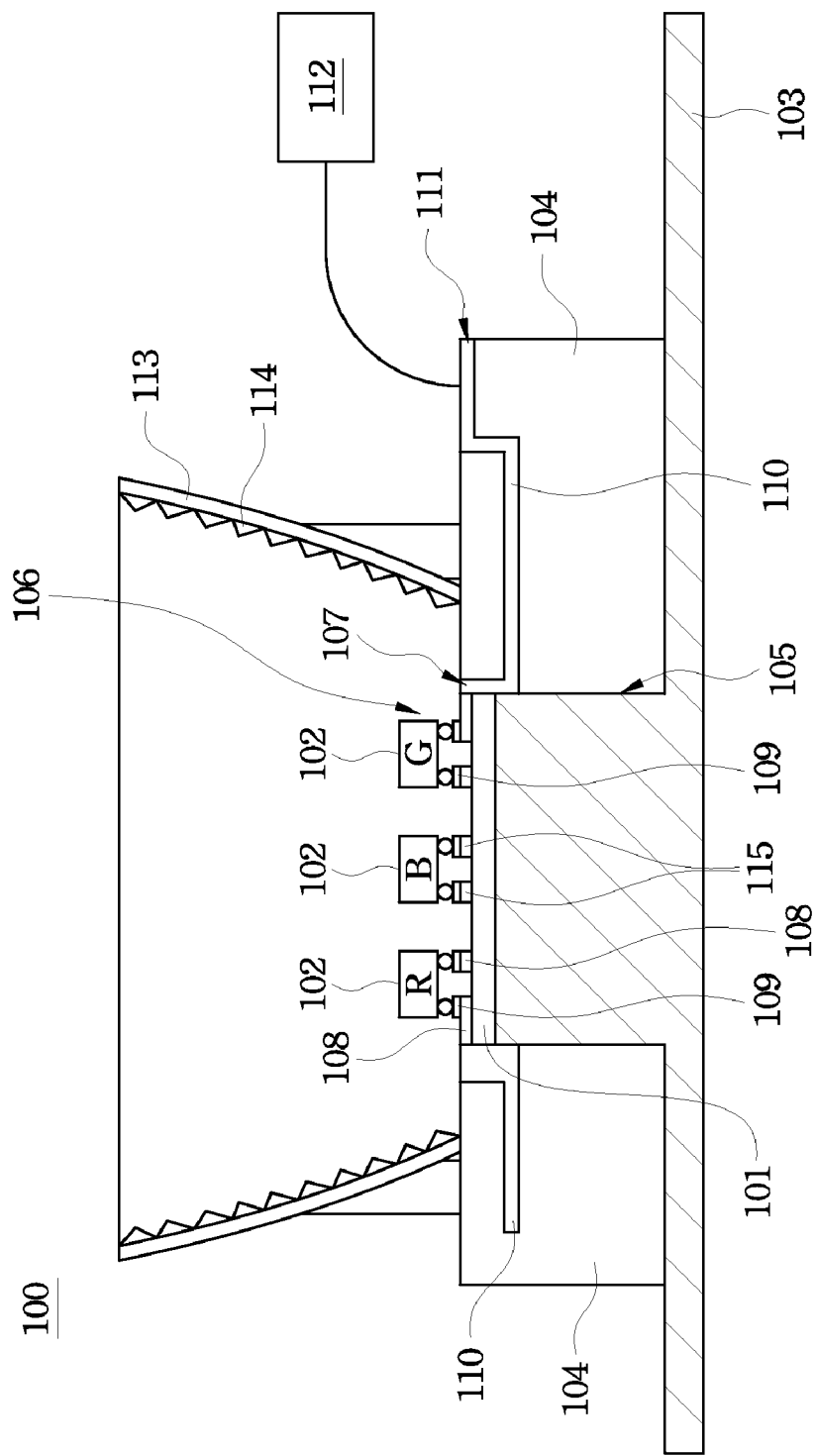
FIG. 1B illustrates a cross-sectional view of LED device 100 shown in FIG. 1A.

FIG. 1A illustrates an explosion diagram of an LED device 100 in accordance with a preferred embodiment of the present invention. FIG. 1B illustrates a cross-sectional view of the LED device 100 shown in FIG. 1A. The LED device 100 comprises a substrate 101, a plurality of flip chips 102, a heat conductive board 103 and an insulating board 104.

In some embodiment of the present invention, these flip chips 102 are plurality of flipped LED dies (hereinafter referred as LED die 102), each of which has at least one pad (not shown) used to electrically connect the LED 102 with the substrate 101 by a flip chip technology. In some embodiments of the present invention the LED dies 102 are symmetrically fixed and electrically connected on the substrate 101. For example, the LED dies 102 are arranged as a matrix fixed and electrically connected on the surface of the substrate 101. The matrix, referring to FIG. 1A, comprises a LED die B with blue color set in the center of the matrix, four LED dies G with green color set on peripheral of the blue LED die B, and four LED dies R with red color filled in the remaining positions of the matrix.

In the present invention, the substrate 101 is a silicon substrate having a plurality of interconnects 108 set therein. Each of the interconnects 108 has an end that connects with a pad 109 set on the surface of the substrate 101 and another end of the corresponding interconnect 108 extends to the edge of the substrate 101 to form a contact in electrically connecting with the external device (not shown). Each LED die 102 is aligned on a plurality of pads 109 and is fixed and eclectically connected to the corresponding pads 109 by a plurality of bumps 115.

The heat conductive board 103 preferably is an electroplated aluminum substrate having a protruding portion 105 used to support the substrate 101. In the present embodiment, the substrate 101 is mounted on the heat conductive board 103 by a eutectic process.

The insulating board 104 is a ceramic board having a plurality of interconnects 110 set therein, wherein the ceramic board has an opening 106 by which the protruding portion 105 of the heat conductive board 103 is sheathed therein, such that the substrate 101 mounted on the heat conductive board 103 can be exposed from the opening 106. Each interconnect 110 has an end adjacent to the opening 106 and is exposed form the opening 106 used to form a contact 107 eclectically connects the interconnect 110 with the corresponding interconnect 108 of the substrate 101. The other end of the corresponding interconnect 110 extends toward the edge of the insulating board 104 and is exposed to form a pad 111 used to be electrically connected with an external device 112. In some preferred embodiment, the external device 112 is a power supplier used to provide energy for driving the LED dies 102.

Figure 1C:
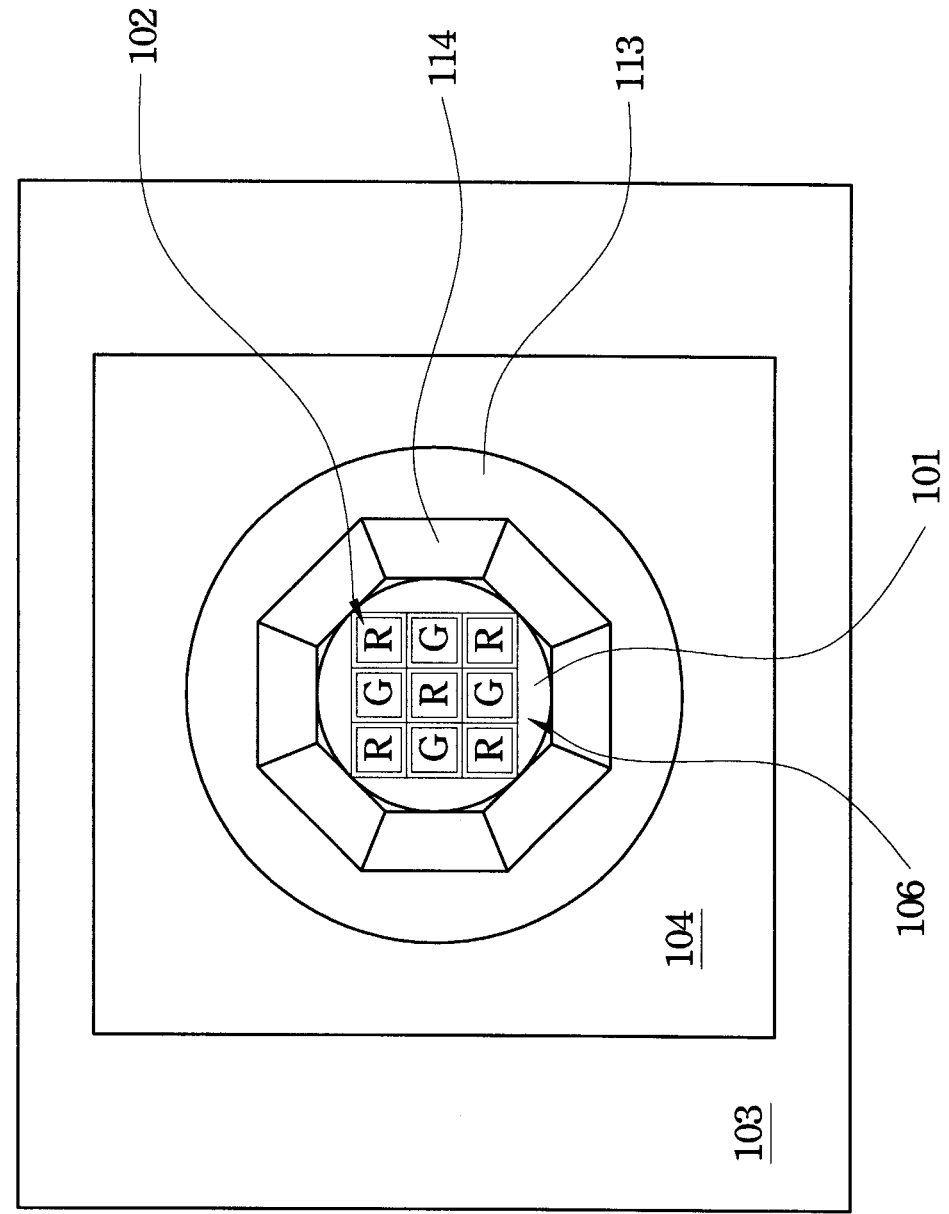
FIG. 1C illustrates a top view of the LED device 100 of present invention shown in FIG. 1A.

FIG. 1C illustrates a top view of the LED device 100 of present invention shown in FIG. 1A, wherein the LED device further comprises an optional reflect cover 113 surrounding the substrate 101.

In some embodiments of the present invention the reflect cover 113 has a plurality of prisms 114 set on the inner sidewall of the reflect cover 113 used to provide multiple reflecting surfaces independent on the optical design of the LED device, whereby light provided by different LED dies with various colors may be mixed more efficiently to emitting light from the LED device with uniform color temperature, so as to result in excellent optical performance.

Since the LED dies 102 mounted on the subtract 101 by the flip chip technology requires smaller pitch, the LED dies 102 can be gathered in a matrix more compactly. Accordingly the surface of the substrate 101 can have more LED dies set thereon, and light provided by these LED dies configured in the matrix may be mixed more efficiently so as to increase the brightness of the LED device 100. In addition, the use of the reflect cover 113 can further improve the brightness of the LED device.

Figure 2:
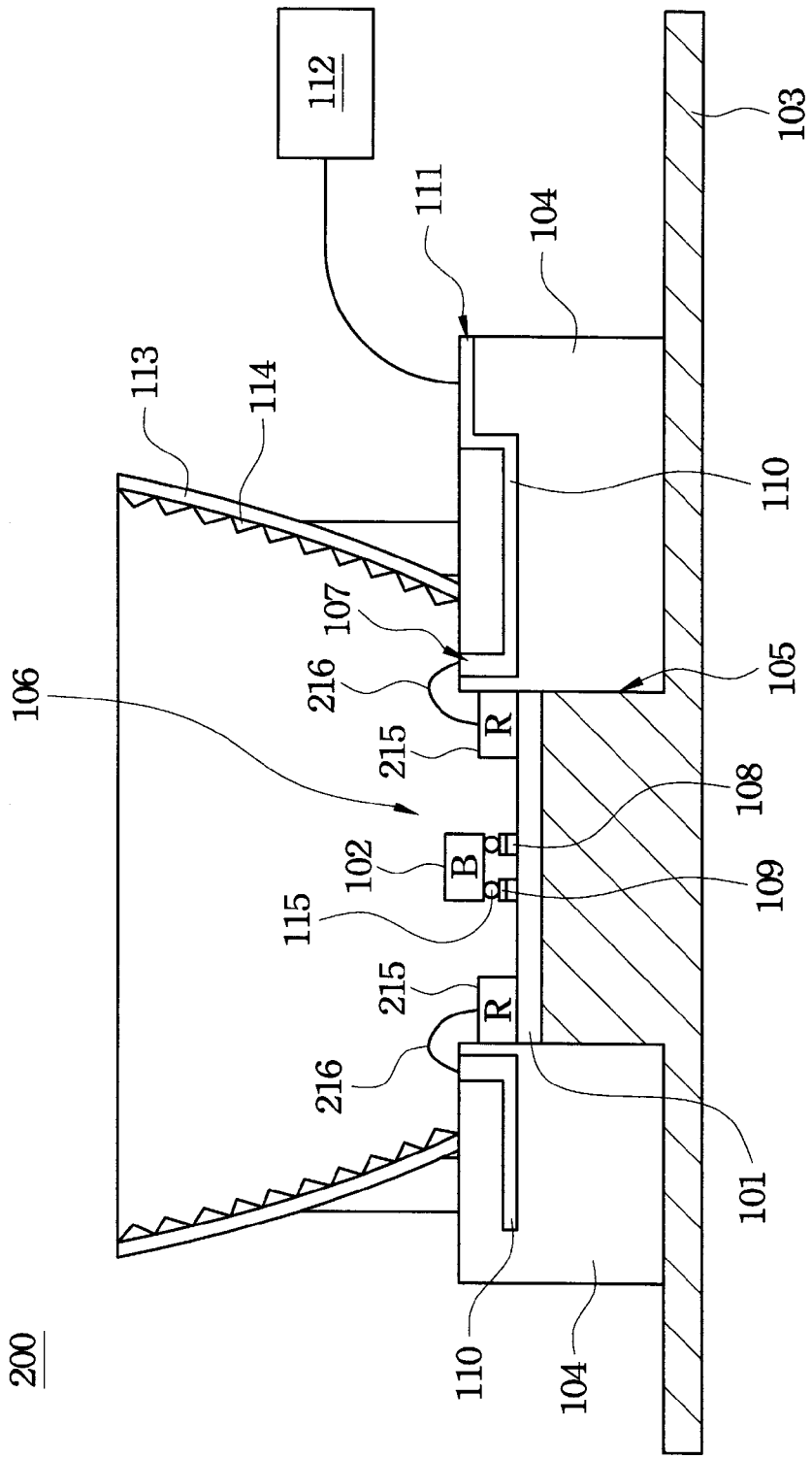
FIG. 2 illustrates a cross-sectional view of a LED device 200 in accordance with another embodiment of the present invention.

FIG. 2 illustrates a cross-sectional view of a LED device 200 in accordance with another embodiment of the present invention. The structure of the LED device 200 is similar with the structure of the LED device 100 (wherein likely reference numbers represent likely elements). However, the major difference between the LED device 100 and the LED device 200 are that the LED device 200 further comprises a plurality of LED dies 215 that are mounted on the substrate 101 with their rear surface by a surface mounting process, wherein each of these LED dies 215 is electrically connected to the substrate 101 via at least one bonding wire. Since this kind of LED die 215 is deposited on the peripheral of the matrix consisting of the LED dies 102, the LED dies 215 can be electrically connected to the insulating board 104 directly via a plurality of bonding wires 216 to form the contact 107. Accordingly this arrangement of using various kinds of LED dies provides more elasticity in circuit design without requiring much additional space. The resulting LED device 200 may both have the advantages of improved brightness and lower cost.

In accordance with the above embodiments, the features of the present invention are to apply a flip chip technology to electrically connect a plurality of LED dies onto a substrate for taking the place of the conventional LED dies that are electrically connected by bonding wires. Since the flip LED dies requires smaller pitch between each two adjacent LED dies, thus the substrate that has a limited mounting surface can have more LED dies set thereon. Light provided by the LED dies with various colors may be mixed more efficiently before being emitted from the LED device due to the smaller pitch, and the brightness of the resulting LED device can also be improved.

In addition, a heat conductive board having a protruding portion is used to support the substrate, and an insulating board with an opening is provided, by which the protruding portion is sheathed and the substrate that is mounted on the protruding portion is exposed from the opening. The LED dies mounted on the substrate are then electrically connected to the pads of the insulating board. Thus heat that is generated by the LED dies can be dispersed via the heat conductive board directly, and the LED dies are electrically interconnected to external devices though interconnects set in the insulating board without any obstacle. Since heat dispersing pathway and the electrical connection of the LED dies are separated, heat generated by the LED dies can be dispersed more efficiently, such that the pitch between the LED can be further decreased and the circuit space of the substrate can be increased to have more LED dies or electrostatic dischargers set thereon, whereby the reliability and die integration of the resulting LED device may be improved. Yet in some embodiments of the present invention, the use of a reflect cover that comprises at lest one prism can further improve the brightness of the LED device.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light emitting semiconductor device comprising:
a substrate;
a plurality of flip chips, electrically connected on the substrate;
a heat conductive board, having a protruding portion used to support the substrate;
an insulating board, having a plurality of connecting pads and an opening, wherein the protruding portion is sheathed in the opening so to expose the substrate mounted on the heat conductive board; and the exposed substrate is electrically connected to the connecting pads, wherein the substrate comprises:

a plurality of mounting pads, on which a plurality of bumps are deposited to electrically connect the mounting pads with the flip chips; and a plurality of wires, each of which has a first end electrically connected to one of the mounting pads and a second end electrically connected to one of the connecting pads; and at least one mounting chip that is mounted on the substrate with its rear surface by a surface mounting process, wherein the mounting chip is deposited on the peripheral of the matrix consisted of the flip chips.

2. The light emitting semiconductor device of claim 1, wherein the connecting pads are connected to at least one external device via a plurality of interconnects.

3. The light emitting semiconductor device of claim 2, wherein the external device is a power supplier used to drive the light emitting semiconductor device.

4. The light emitting semiconductor device of claim 1, further comprising a reflect cover surrounding the substrate.

5. The light emitting semiconductor device of claim 1, wherein these flip chips are selected from the group consisting of a light emitting diode (LED), an ultra high efficiency LED chip and a laser diode chip.

6. The light emitting semiconductor device of claim 1, wherein the heat conductive board is an electroplated aluminum substrate.

7. The light emitting semiconductor device of claim 6, wherein the substrate is mounted on the electroplated aluminum substrate by a eutectic process.

8. The light emitting semiconductor device of claim 1, wherein the substrate is a silicon substrate.

9. The light emitting semiconductor device of claim 1, wherein the flip chips are symmetrically fixed and electrically connected on the substrate.

10. A light emitting semiconductor device comprising:
a substrate;
a plurality of flip chips, electrically connected on the substrate;
a heat conductive board, having a protruding portion used to support the substrate;
an insulating board, having a plurality of connecting pads and an opening, wherein the protruding portion is sheathed in the opening so to expose the substrate mounted on the heat conductive board; and the exposed substrate is electrically connected to the connecting pads; and
a reflect cover surrounding the substrate, wherein the reflect cover has a plurality of prism set on the inner sidewall thereof.

* * * * *